United States Patent
Chen et al.

(10) Patent No.: US 10,488,766 B2
(45) Date of Patent: Nov. 26, 2019

(54) LITHOGRAPHY SYSTEM HAVING INVISIBLE PELLICLE OVER MASK

(71) Applicant: Taiwan Semiconductor Manufacturing Co., Ltd., Hsinchu (TW)

(72) Inventors: Chiu-Hsiang Chen, Hsinchu County (TW); Shih-Ming Chang, Zhubei (TW); Chih-Jie Lee, Taipei (TW); Han-Wei Wu, Tainan (TW); Yung-Sung Yen, New Taipei (TW); Ru-Gun Liu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/907,043

(22) Filed: Feb. 27, 2018

(65) Prior Publication Data

US 2019/0146362 A1   May 16, 2019

Related U.S. Application Data

(60) Provisional application No. 62/586,939, filed on Nov. 16, 2017.

(51) Int. Cl.
   *G03F 1/00*   (2012.01)
   *G03F 7/20*   (2006.01)
   *G03F 1/62*   (2012.01)
   *G03F 1/22*   (2012.01)

(52) U.S. Cl.
   CPC .......... *G03F 7/70983* (2013.01); *G03F 1/22* (2013.01); *G03F 1/62* (2013.01); *G03F 7/2006* (2013.01); *G03F 7/70025* (2013.01); *G03F 7/70916* (2013.01)

(58) Field of Classification Search
   CPC ............. H01L 21/6831; H01L 21/6833; H01L 21/308; H01J 37/32532; H01J 37/3266; H01J 37/32669
   See application file for complete search history.

(56) References Cited

U.S. PATENT DOCUMENTS

| | | | |
|---|---|---|---|
| 6,781,673 B2 * | 8/2004 | Moors | G03F 7/70558 355/53 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |

(Continued)

*Primary Examiner* — Mesfin T Asfaw
(74) *Attorney, Agent, or Firm* — Birch, Stewart, Kolasch & Birch, LLP

(57) ABSTRACT

A lithography system is provided. The lithography system includes a mask and an optical module. The optical module is configured to optically form an invisible pellicle over the mask to protect the mask from contaminant particles. As a solid pellicle used in the prior arts is omitted, the critical dimension (CD) error from the boarder effect due to reflection of some light by the solid pellicle and the exposure radiation energy consumption caused by the solid pellicle can be avoided.

20 Claims, 13 Drawing Sheets

(56) References Cited

U.S. PATENT DOCUMENTS 9,548,303 B2 1/2017 Lee et al.
2009/0002790 A1* 1/2009 Plewa .................. B82Y 10/00
359/35

* cited by examiner

LITHOGRAPHY SYSTEM HAVING INVISIBLE PELLICLE OVER MASK

CROSS REFERENCE TO RELATED APPLICATIONS

The present application claims priority of U.S. Provisional Patent Application No. 62/586,939, filed on Nov. 16, 2017, the entirety of which is incorporated by reference herein.

BACKGROUND

The semiconductor integrated circuit (IC) industry has experienced exponential growth. Technological advances in IC materials and design have generated generations of ICs, wherein each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL).

The EUVL employs scanners using light in the extreme ultraviolet (EUV) region, having a wavelength of about 1 nm to about 100 nm. The EUVL is very similar to common optical lithography in that it needs a mask to print wafers, except that it employs light in the EUV region, e.g., at 13.5 nm. At the wavelength of 13.5 nm or so on, all materials are highly absorbing. Thus, the EUV scanners use reflective optics rather than refractive optics, i.e. mirrors instead of lens and reflective masks are used. The EUV scanners provide the desired circuit pattern on an absorption layer (EUV mask absorber) formed on a reflective mask. A multi-layered (ML) structure is used as a EUV mask blank. Moreover, EUV masks typically require a pellicle membrane, which serves as a protective cover to protect the EUV mask from damage and/or contaminant particles.

Although existing EUV lithography systems and processes have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
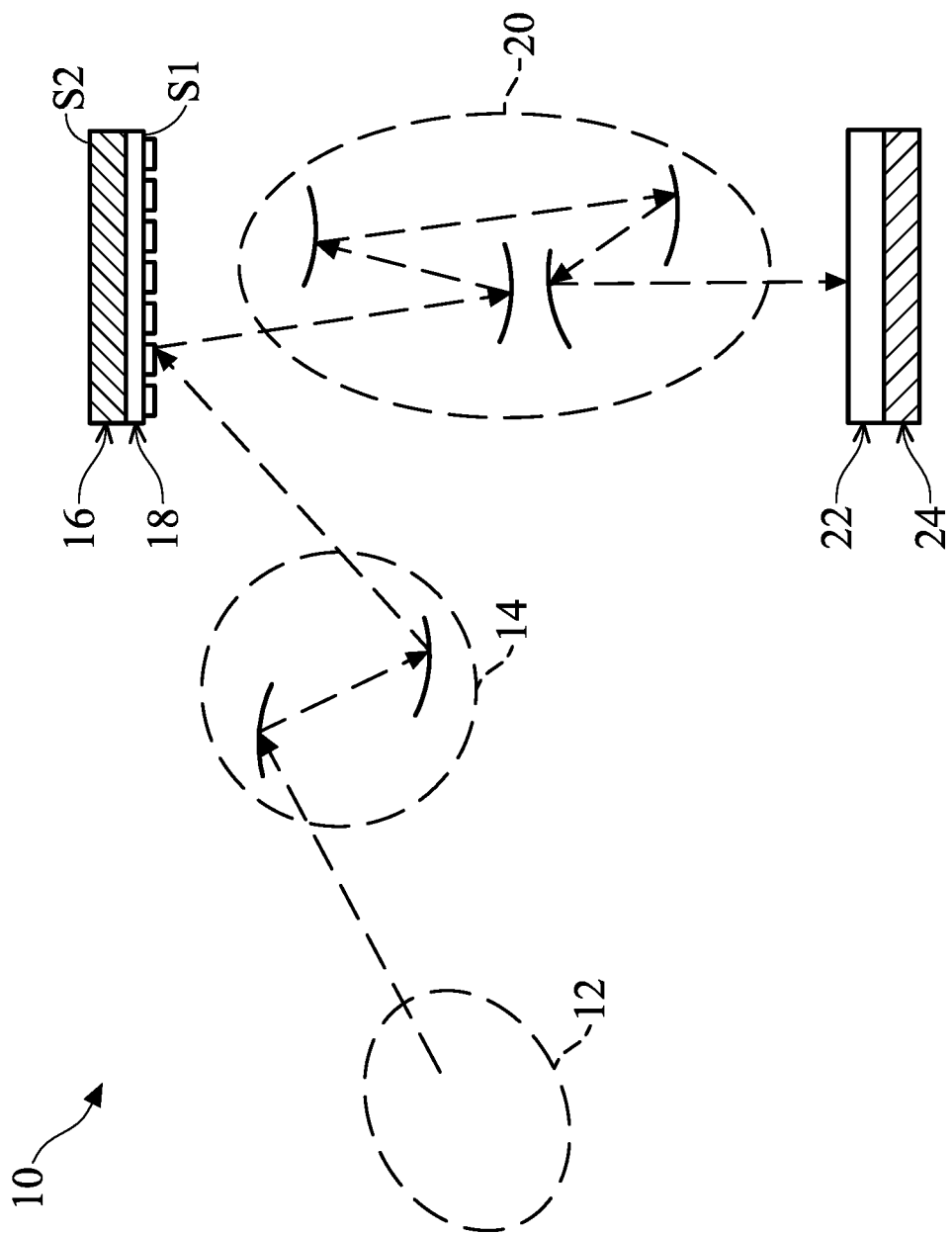
FIG. 1 schematically shows a lithography system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

The advanced lithography process, method, and materials described in the current disclosure can be used in many applications, including fin-type field effect transistors (FinFETs). For example, the fins may be patterned to generate a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of a lithography system 10 in accordance with some embodiments. The lithography system 10 may also be generically referred to as a scanner that is operable to perform lithography exposing processes with respective radiation source and exposure mode. In some embodiments, the lithography system 10 is an extreme ultraviolet (EUV) lithography system designed to expose a photoresist layer by EUV light. The photoresist layer comprises a material sensitive to EUV light. The EUV lithography system 10 employs a radiation source 12 to generate EUV light, such as EUV light having a wavelength ranging between about 1 nm and about 100 nm. In one exemplary embodiment, the radiation source 12 generates EUV light with a wavelength centered at about 13.5 nm. Accordingly, the radiation source 12 is also referred to as a EUV radiation source 12.

The lithography system 10 also employs an illuminator 14. In some embodiments, the illuminator 14 includes various reflective optics, such as a single mirror or a mirror system having multiple mirrors in order to direct light from the radiation source 12 onto a mask 18 secured on a mask stage 16. In some embodiments, the illuminator 14 includes a dipole illumination component.

In some embodiments, the illuminator 14 is operable to configure the mirrors to provide a proper illumination to the mask 18. For example, the mirrors of the illuminator 14 are switchable to reflect EUV light from the radiation source 12 to different illumination positions. Alternatively, a stage prior to the illuminator 14 may additionally include other switchable mirrors that are controllable to direct EUV light to different illumination positions with the mirrors of the illuminator 14. In some embodiments, the illuminator 14 is configured to provide an on-axis illumination (ONI) to the mask 18. In an exemplary embodiment, a disk illuminator 14 with partial coherence σ being at most 0.3 is employed. In some other embodiments, the illuminator 14 is configured to provide an off-axis illumination (OAI) to the mask 18. In an exemplary embodiment, the illuminator 14 is a dipole illuminator. The dipole illuminator has a partial coherence σ of at most 0.3 in some embodiments.

The lithography system 10 also includes a mask stage 16 configured to secure the mask 18. In some embodiments, the mask stage 16 includes an electrostatic chuck (e-chuck) to secure the mask 18. This is because gas molecules will absorb EUV light, and thus the lithography system 10 for the EUV lithography patterning is maintained in a vacuum environment to avoid the EUV intensity loss. In some embodiment, the mask stage 16 is also operable to drive the mask 18 in a given scanning direction, e.g., during a scan mode of the lithography system 10. In the present disclosure, the terms of mask, photomask, and reticle are used interchangeably to refer to the same item.

The mask 18 is provided and used to transfer circuit patterns (e.g. the design of a layer of an IC) onto a semiconductor substrate 22. In some embodiment, the mask 18 is a reflective mask (for a EUV lithography system 10). In some embodiments, in the lithography system 10 (see FIG. 1), the reflective mask 18 is held by the mask stage 16 such that a patterned surface S1 faces downward (i.e. faces the substrate stage 24) and a chucking surface S2 opposite to the patterned surface S1 faces the mask stage 16.

Figure 2:
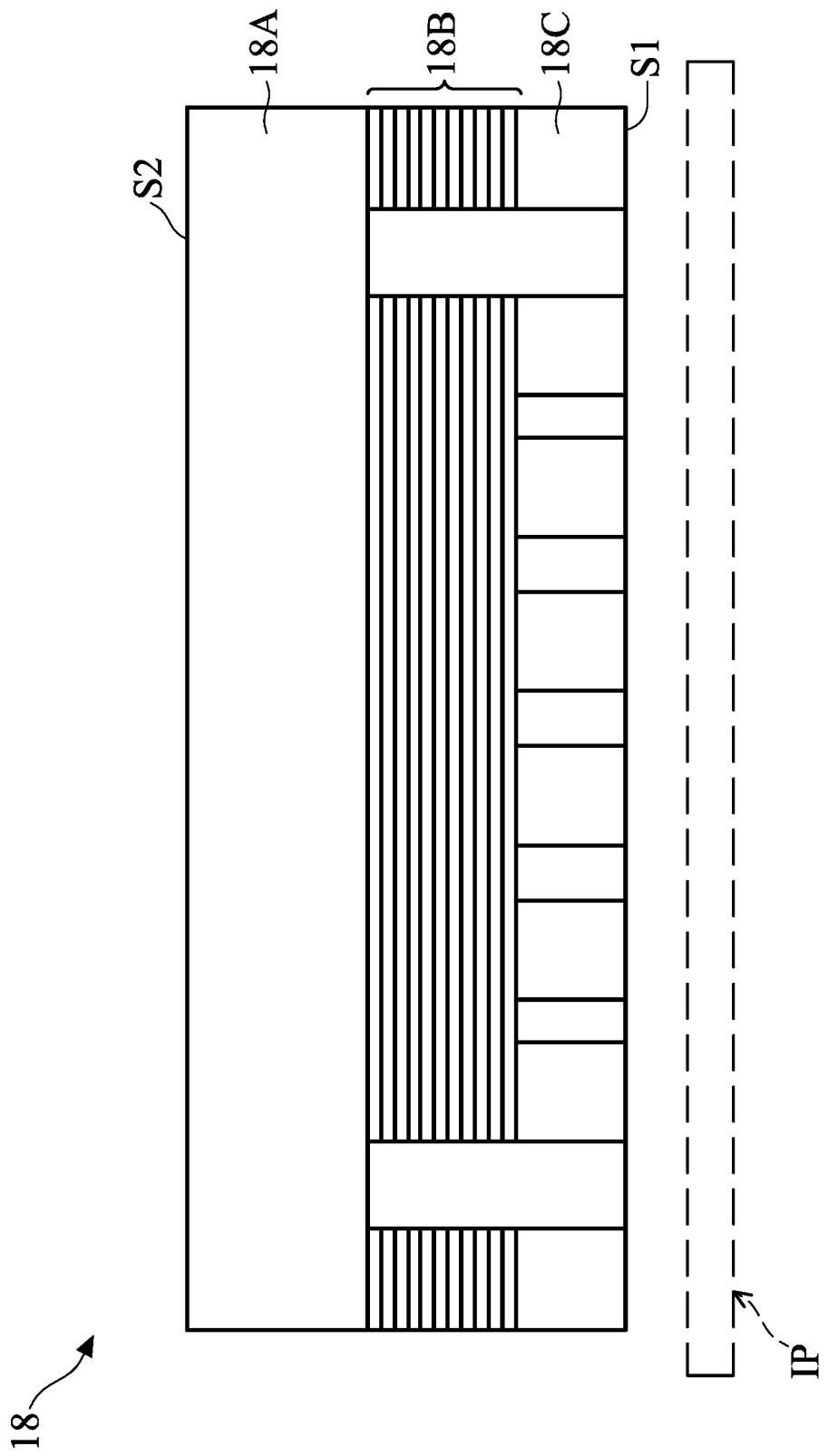
FIG. 2 schematically shows the structure of a reflective mask in accordance with some embodiments.

FIG. 2 schematically shows the structure of a reflective mask 18 in accordance with some embodiments. The reflective mask 18 includes a substrate 18A with a suitable material, such as a low thermal expansion material (LTEM) or fused quartz. In some embodiments, the LTEM includes $TiO_2$ doped $SiO_2$, or another suitable material with low thermal expansion. The reflective mask 18 also includes a reflective multi-layer (ML) 18B formed over the substrate 18A. The reflective ML 18B includes a plurality of film pairs, such as molybdenum-silicon (Mo/Si) film pairs (e.g., a layer of molybdenum above or below a layer of silicon in each film pair). Alternatively, the reflective ML 18B may include molybdenum-beryllium (Mo/Be) film pairs, or another suitable material that is configurable to highly reflect EUV light. In some embodiments, the reflective mask 18 may further include a capping layer, such as ruthenium (Ru), formed over the reflective ML 18B for protection. The reflective mask 18 further includes an absorption layer 18C formed over the reflective ML 18B. In some embodiments, the absorption layer 18C is patterned to define a layer of an IC, thereby forming the patterned surface S1 of the reflective mask 18. Alternatively, another reflective layer may be deposited over the reflective ML 18B and is patterned to define a layer of an IC.

Back to FIG. 1, the lithography system 10 also includes a projection optics module (or projection optics box (POB)) 20 for imaging the circuit patterns of the mask 18 onto a semiconductor substrate 22 secured on a substrate stage 24. In some embodiments, the projection optics module 20 includes various reflective optics, such as a single mirror or a mirror system having multiple mirrors. The light reflected from the mask 18, carrying the image of the circuit patterns defined on the mask 18, is collected by the projection optics module 20. The illuminator 14 and the projection optics module 20 are collectively referred to as an optical module of the lithography system 10.

The lithography system 10 also includes a substrate stage 24 configured to secure the semiconductor substrate 22 to be patterned. In some embodiments, the substrate stage 24 is also operable to drive the semiconductor substrate 22 in a given scanning direction, e.g., during a scan mode of the lithography system 10. In some embodiments, the semiconductor substrate 22 is a semiconductor wafer, such as a silicon wafer or another type of wafer. The semiconductor substrate 22 is coated with a photoresist layer sensitive to the radiation beam, such as EUV light in some embodiments. Various components including those described above are integrated together and are operable to perform lithography exposing process.

The lithography system 10 may further include other modules or be integrated with (or be coupled with) other modules. For example, the lithography system 10 further includes a blade module 34 in some embodiments (see FIG. 5). The blade module 34 is used to define an exposure slit 340 through which an exposure radiation beam from the illuminator 14 passes to illuminate a particular portion (i.e. an exposure field) on the mask 18, and an image of which is projected onto the semiconductor substrate 22. During a scan (mode) of the lithography system 10, the mask 18 is moved so that the illuminated portion scans the whole pattern to be imaged (i.e. the position of the blade module 34 relative to the mask 18 will change accordingly), and the semiconductor substrate 22 is moved synchronously in the opposite direction to the mask 18 so that the whole pattern is imaged onto the semiconductor substrate 22. At the end of a scan, the mask 18 is moved to the beginning of the next pattern to be illuminated and the semiconductor substrate 22 is stepped to the beginning of the next field to be imaged, and the lithography exposing process is repeated.

It should be realized that in EUV lithography scanners at highly vacuum (e.g. $10^{-6}$ torr or below), free floating particles (e.g. in size range from few nm to less than about 1 μm in diameter) are a cause for concern as they can land on the mask 18 held in the upper region of the lithography system 10. These particles on the mask 18 can easily lead to major defects in the ICs produced by the lithography system 10. Therefore, there is a need to keep the patterned surface S1 of the mask 18 free from contamination of the floating particles so that circuit patterns can be transferred onto the semiconductor substrate 22 without aberrations and defects.

In some embodiments of the lithography system 10 (e.g. EUV lithography system) described below, various optical modules are provided to optically form or generate an invisible pellicle over the mask 18 to protect the mask 18 from contaminant particles. The mechanism of forming the invisible pellicle will be described later. The variations of some embodiments are also discussed. Throughout the various views and illustrative embodiments, like reference numbers are used to designate like elements.

Figure 3:
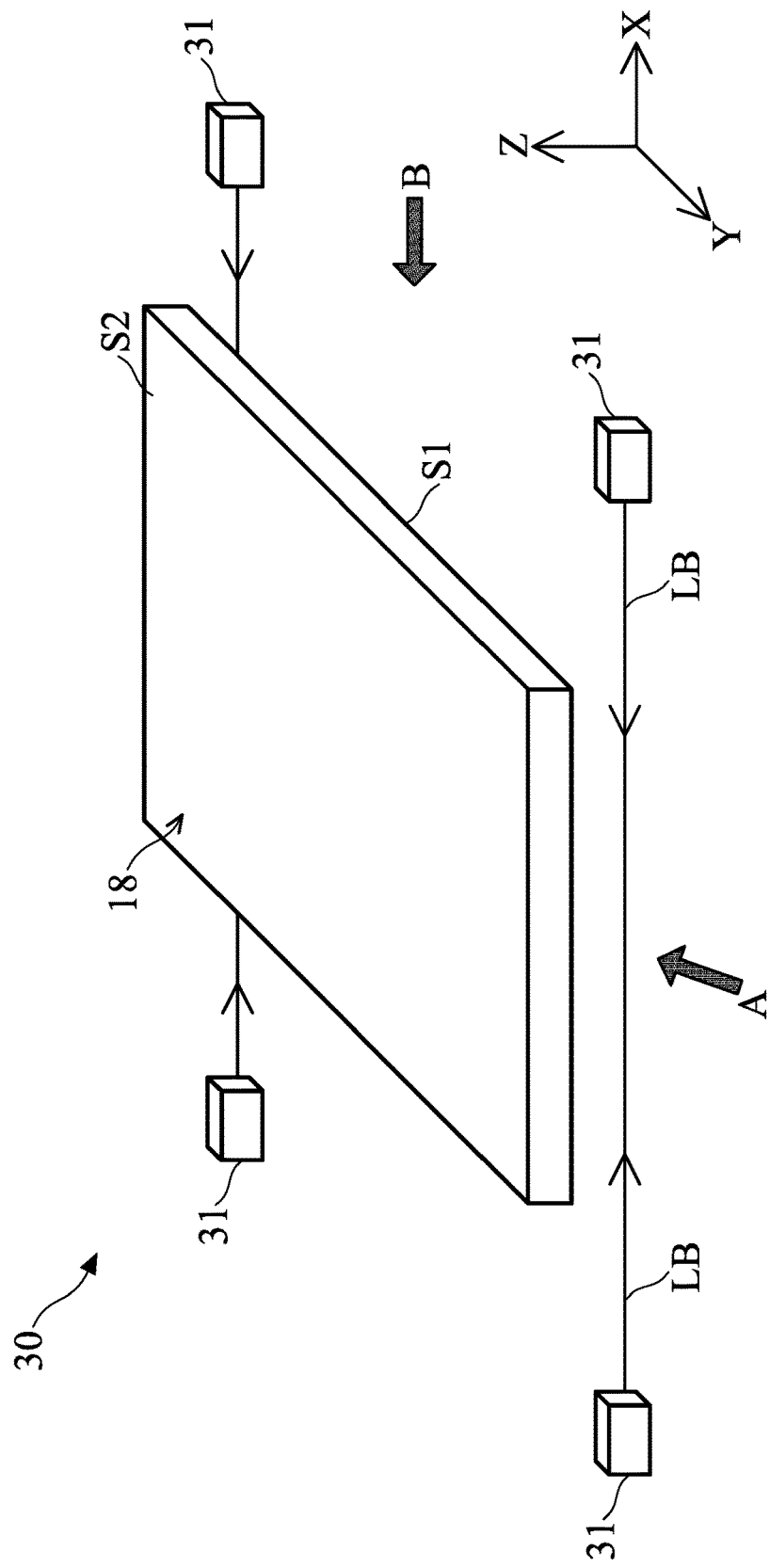
FIG. 3 schematically shows the relative position of the mask and an optical module in accordance with some embodiments.
Figure 4:
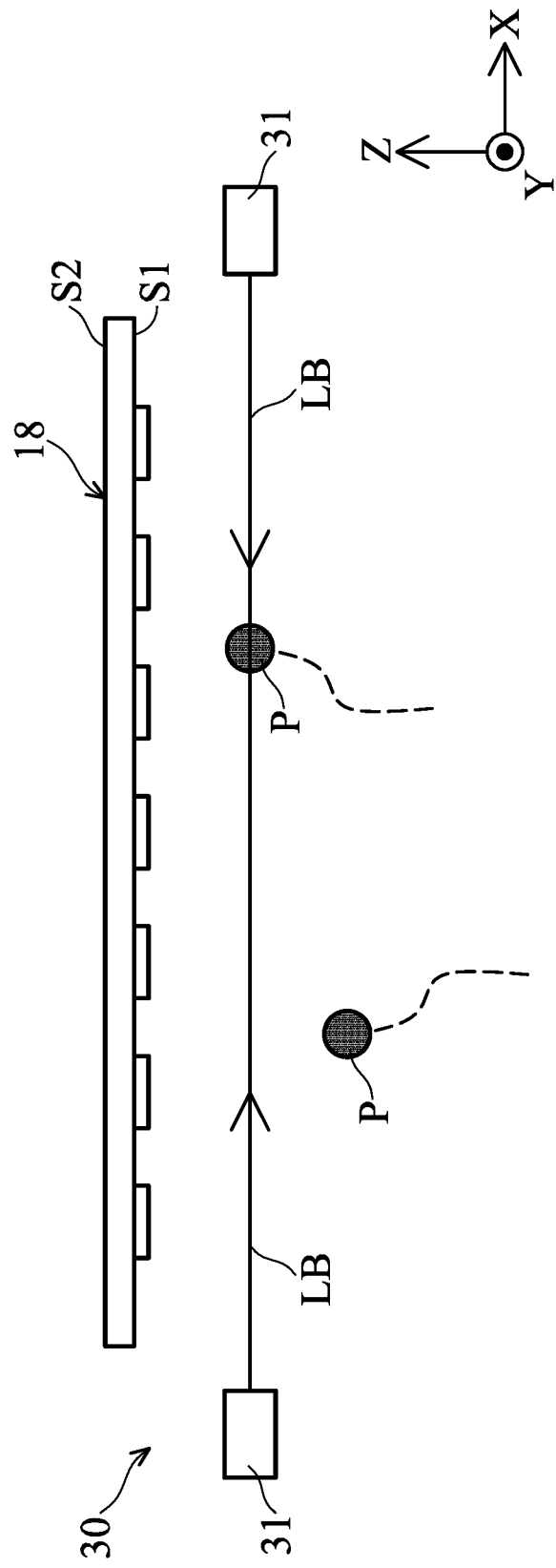
FIG. 4 is a side view as viewed in the direction of arrow A in FIG. 3
Figure 5:
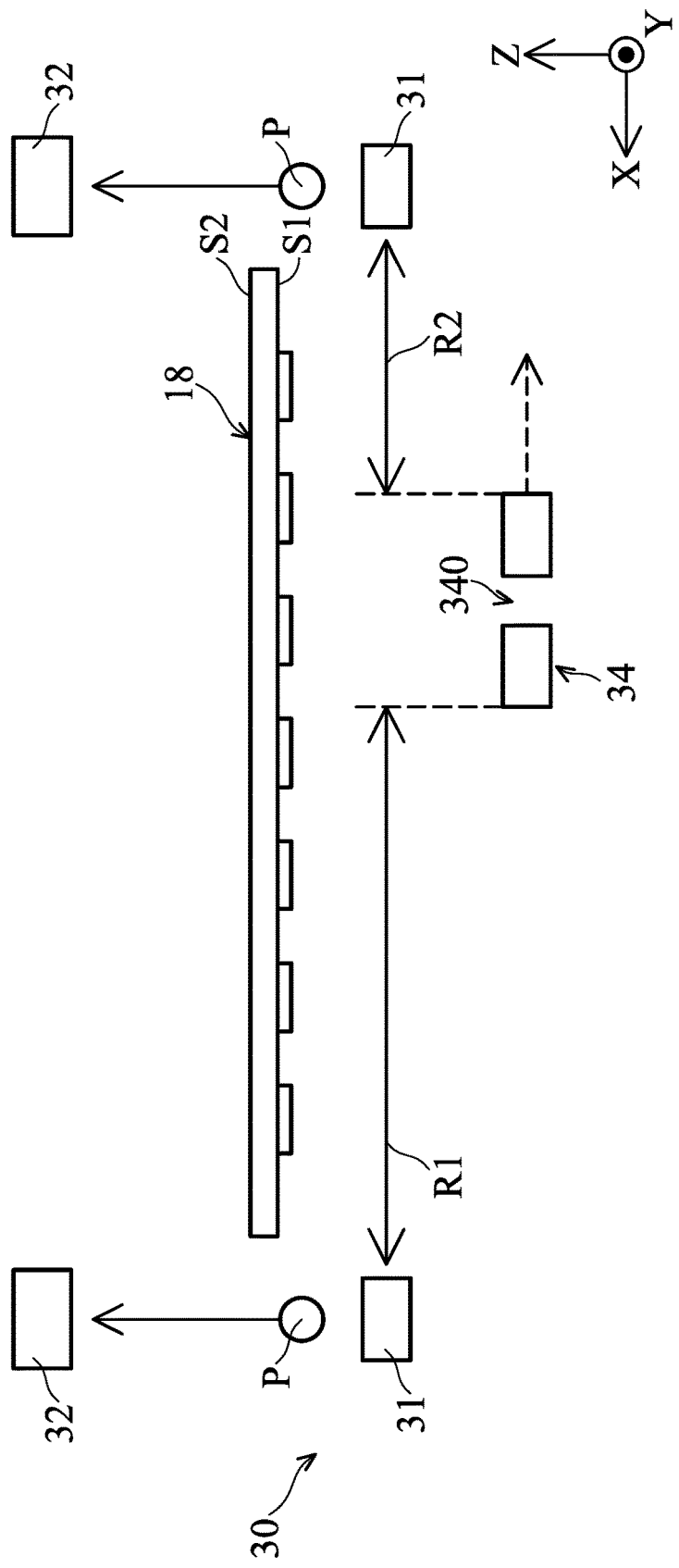
FIG. 5 is a side view as viewed in the direction of arrow B in FIG. 3.

FIG. 3 is a schematic view showing the relative position of the mask 18 and an optical module 30, in accordance with some embodiments. FIG. 4 is a side view as viewed in the direction of arrow A in FIG. 3. FIG. 5 is a side view as viewed in the direction of arrow B in FIG. 3. In some embodiments, the optical module 30 includes at least one laser unit pair, for example, two laser unit pairs (see FIGS. 3 to 5). A single laser unit pair includes two laser units 31 provided on opposite sides of the mask 18 and positioned on the outer periphery of the mask 18. In addition, the laser units 31 of the two laser unit pairs are positioned adjacent to the four corners of the rectangular mask 18. However, it should be appreciated that many variations and modifications can be made to the embodiments of the disclosure.

In some embodiments, the two laser units 31 of one laser unit pair are configured to generate a pair of opposing laser beams LB on the outer periphery of the mask 18 (see FIGS. 3 and 4). In addition, the generated laser beams LB have a distance from the patterned surface S1 of the mask 18.

Figure 6:
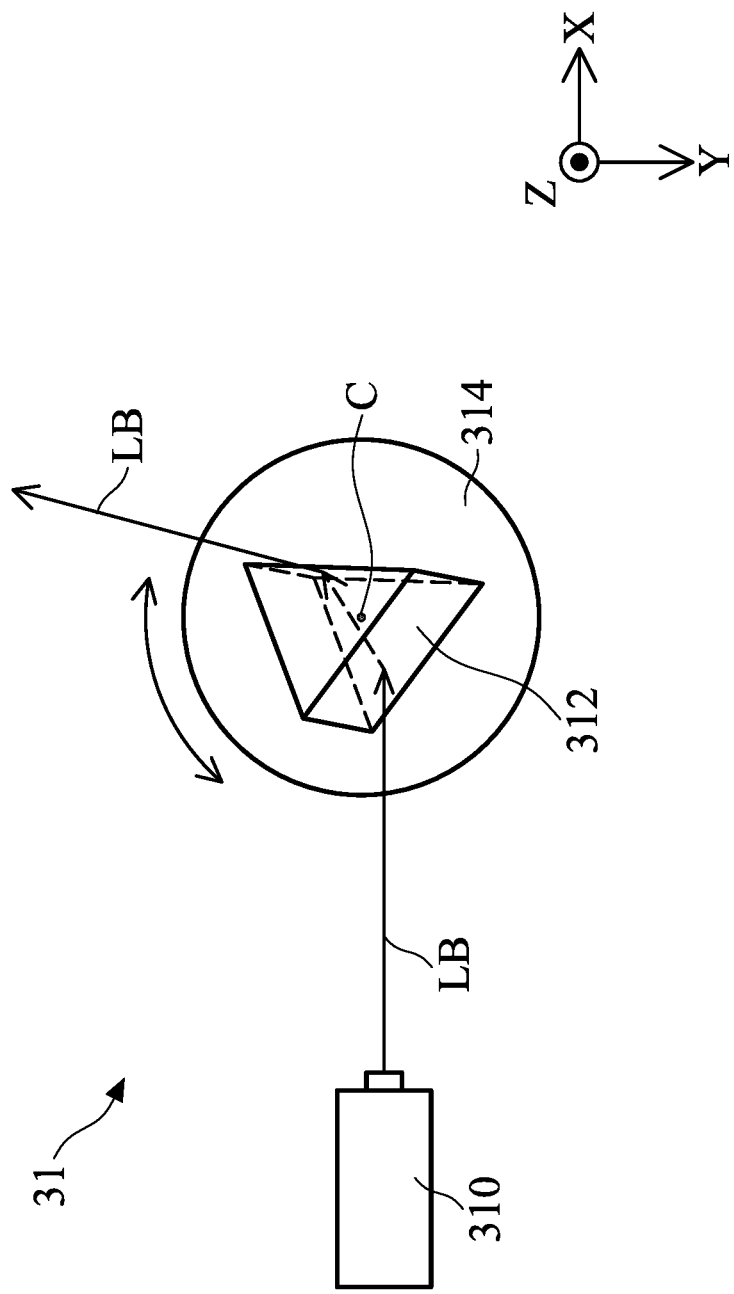
FIG. 6 schematically shows some components of a laser unit in FIG. 3.

In some embodiments, as shown in FIG. 6, each laser unit 31 includes a laser source 310, a prism 312 (e.g. triangular prism), and a rotatable platform 314. The laser source 310 can generate a laser beam LB toward the prism 312 disposed on the rotatable platform 314. In some embodiments, the laser source 310 includes argon (Ar) laser source, $CO_2$ laser source, He—Ne laser source, or another optional laser source. The prism 312 (i.e. a movable optic) is placed at the center C of the circular rotatable platform 314 and can deflect and direct the laser beam LB from the laser source 310. The rotatable platform 314 is rotatable about its center C with a predetermined speed through driven by a motor (not shown). Although not shown, the laser unit 31 further includes a controller for controlling, for example, the operation and power level of the laser source 310 and the rotational direction and speed of the rotatable platform 314 (i.e. the scanning direction and speed of the laser beam LB). In addition, the laser unit 31 may include a lens for focusing the laser beam LB from the laser source 310.

Figure 7:
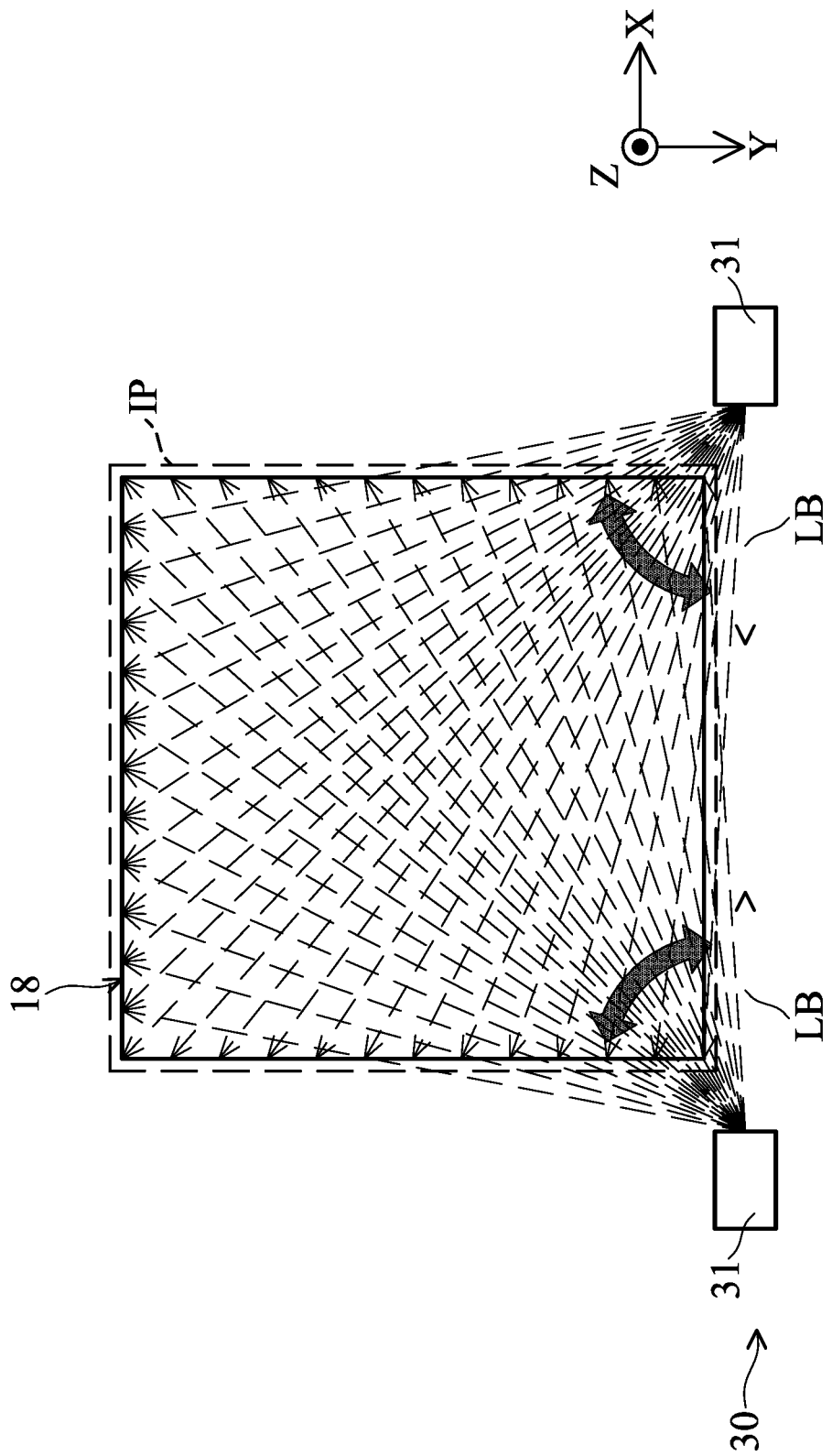
FIG. 7 schematically shows that the optical module in FIG. 3 generates a pair of laser beams to scan back and forth over the mask to optically form an invisible pellicle for the mask.

With these configurations, the two laser units 31 of one laser unit pair are also operable to generate a pair of laser beams LB to horizontally scan back and forth over the patterned surface S1 of the mask 18, as shown in FIG. 7 (note that the laser beams LB are scanning below the mask 18 and thus are depicted by dashed lines in the figure). When a floating particle P moves to the vicinity of the patterned surface S1 of the mask 18 and is scanned by one of the laser beams LB, the laser beam LB can produce radiation pressure to trap the floating particle P (this is so-called "Optical tweezers effect") and prevent the floating particle P from moving upwardly toward the patterned surface S1 of the mask 18 (see FIG. 4). It should be appreciated that optical tweezers are capable of manipulating nanometer and micron-sized dielectric particles by exerting extremely small forces via a highly focused laser beam. The narrowest point of the focused laser beam, known as the beam waist, contains a very strong electric field gradient. Dielectric particles can be attracted along the gradient to the region of strongest electric field, which is the center of the laser beam. This is due to conservation of momentum: photons that are absorbed or scattered by the tiny dielectric particle impart momentum to the dielectric particle. In addition, the laser light also tends to apply a force on particles in the beam along the direction of beam propagation. Accordingly, the trapped particle P can also be clamped between the two laser beams LB from the two opposing laser units 31

Accordingly, the scanning laser beams LB provided by the optical module 30 can optically form an invisible pellicle IP (as depicted by dashed lines in FIGS. 2 and 7) over the patterned surface S1 of the mask 18 to trap contaminant particles P and avoid the contaminant particles P moving onto the patterned surface S1 of the mask 18. However, it should be appreciated that many variations and modifications can be made to the embodiments of the disclosure. For example, the optical module 30 can also optically form a number of invisible pellicles IP (located at different heights in the Z-axis direction) over the patterned surface S1 of the mask 18 to better protect the mask 18.

After trapping contaminant particle or particles P near the patterned surface S1 of the mask 18, the laser beams LB from the laser units 31 move the contaminant particles P away from the patterned surface S1 of the mask 18 and back to the outer periphery of the mask 18, as shown in FIGS. 3 and 5. Afterward, the trapped contaminant particles P can be removed by at least one particle remover 32 provided on at least one side of the mask 18 corresponding to the laser units 31. In some embodiments, the particle remover 32 removes (e.g. absorbs) the trapper particles P by means of electrostatic force or gas flow (e.g. vacuum attraction force) from the laser beams LB while the power level of the laser sources 310 (FIG. 6) is temporarily reduced or terminated. However, other techniques that can remove the trapped particles P may also be used. In some embodiments, after removing the trapped particles P from the laser beams LB, the particle remover 32 is then removed from the lithography system 10 for clean processing. In some embodiments, the number and position of the particle removers 32 correspond to those of the laser unit pairs.

In some embodiments, in the case that a blade module 34 for defining an exposure slit 340 within an exposure field on the mask 18 exists, the scan regions of the laser beams LB from the laser unit pairs are determined by the position of the blade module 34 relative to the mask 18 and are changed accordingly. For example, as shown in FIG. 5, when the blade module 34 moves relative to the mask 18 from the left side to the right side, the scan region R1 of the laser beams LB from the laser unit pairs on the left side is increased and the scan region R2 of the laser beams LB from the laser unit pairs on the right side is decreased. The scan regions R1 and R2 do not exceed the boundaries of the blade module 34, so that the scanning laser beams LB from the optical module 30 do not interfere with the exposure radiation beam projected onto the patterned surface S1 of the mask 18 during the lithography exposing process.

Figure 8:
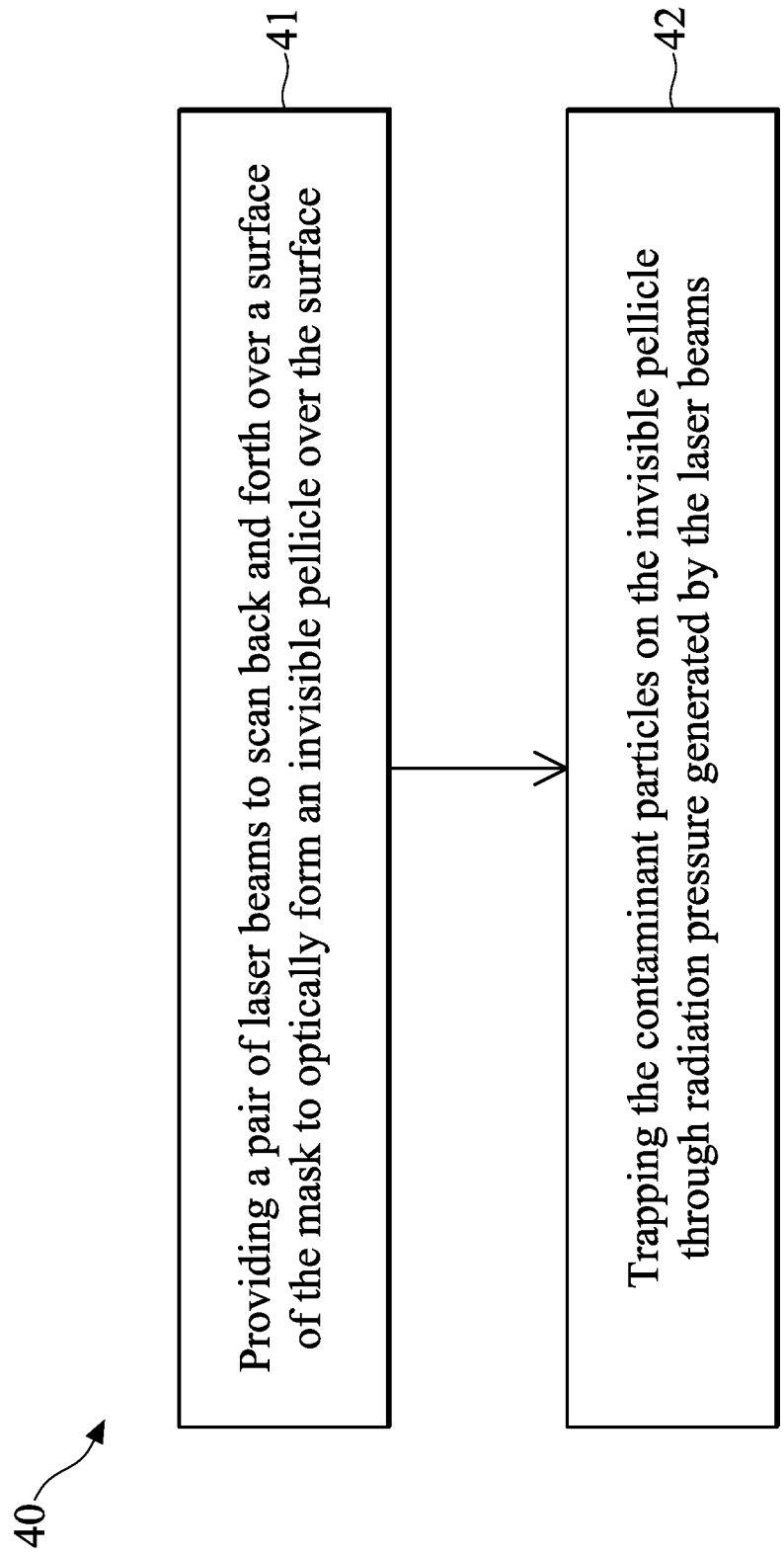
FIG. 8 is a simplified flow chart of a method for protecting a mask from contaminant particles, in accordance with some embodiments.

FIG. 8 is a simplified flow chart of a method 40 for protecting a mask from contaminant particles, in accordance with some embodiments. For illustration, the flow chart will be described in company with the schematic views shown in FIGS. 3 to 7.

The method 40 includes an operation 41, in which a pair of laser beams LB are provided by the optical module 30

(see FIGS. 3 to 7) to scan back and forth over a surface (e.g. the patterned surface S1) of a mask 18 to optically form an invisible pellicle IP over the patterned surface S1. In some embodiments, the invisible pellicle IP is flat. In addition, the invisible pellicle IP is formed at a distance from the patterned surface S1 of the mask 18. In some embodiments, the scanning laser beams LB do not interfere with an exposure radiation beam projected from the illuminator 14 (see FIG. 1) onto the patterned surface S1 of the mask 18 during the lithography exposing process.

The method 40 further includes an operation 42, in which contaminant particles P (e.g. floating particles) are trapped on the invisible pellicle IP through radiation pressure generated by the laser beams LB, as shown in FIG. 3. In some embodiments, the contaminant particles P may be trapped in the potential well generated by the focused laser beam LB from one laser unit 31 (i.e. optical tweezers) of the optical module 30. Accordingly, the invisible pellicle IP prevents the contaminant particles P moving onto the patterned surface S1 of the mask 18.

Some operations may be added into the method 40 in different embodiments. For example, the method 40 further comprises moving the contaminant particles P trapped by the laser beams LB away from the patterned surface S1 of the mask 18 in some embodiments. In addition, the method 40 further comprises removing the trapped contaminant particles P by the particle removers 32 (see FIG. 5) when the trapped contaminant particles P are moved away from the patterned surface S1 of the mask 18 by the laser beams LB. In some embodiments, the removal of the trapped contaminant particles P is achieved by means of electrostatic force or gas flow.

Figure 9:
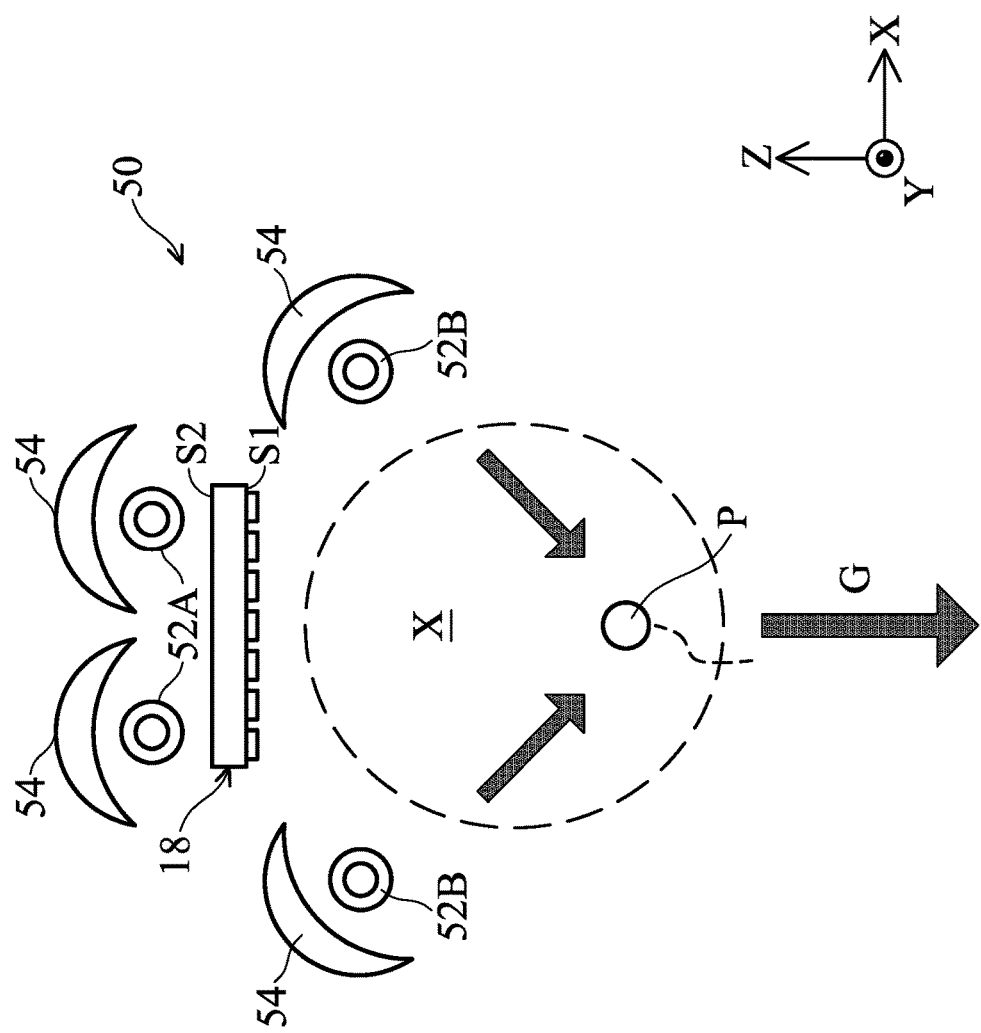
FIG. 9 schematically shows the relative position of the mask and an optical module in accordance with other some embodiments.
Figure 10:
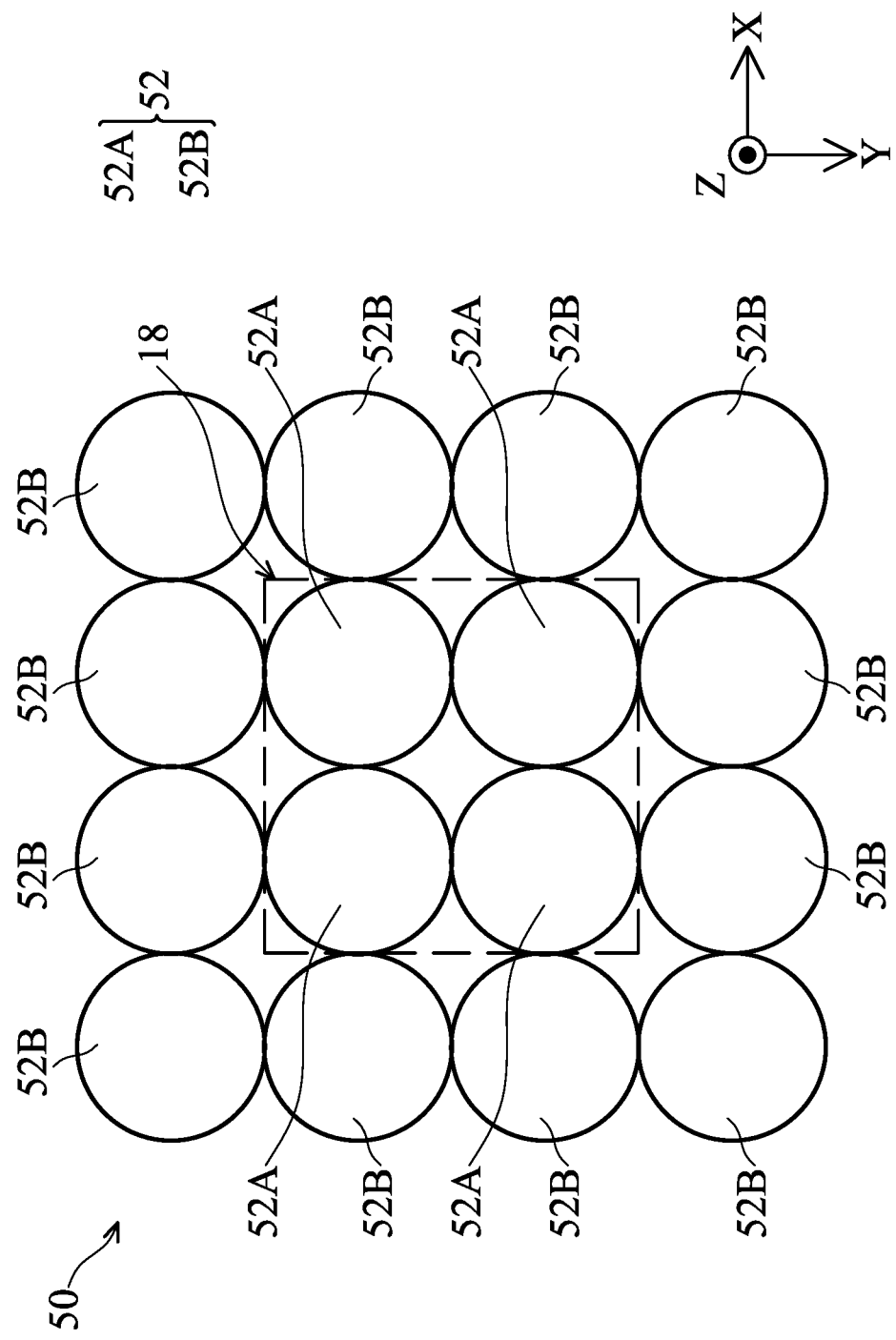
FIG. 10 schematically shows the relative position of the mask and the optical module in FIG. 9 from another viewing angle.

FIG. 9 schematically shows the relative position of the mask 18 and an optical module 50 in accordance with other some embodiments. FIG. 10 schematically shows the relative position of the mask 18 and the optical module 50 in FIG. 9 from another viewing angle. It should be noted that the mask stage 16 are not shown in FIGS. 9 and 10 for the purpose of simplicity and clarity.

In some embodiments, the optical module 50 includes a number of illumination sources 52 provided near the mask 18. In some embodiments, as shown in FIGS. 9 and 10, the illumination sources 52 includes one or more first illumination sources 52A (e.g. four first illumination sources 52A) provided over the chucking surface S2 of the mask 18. In addition, the illumination sources 52 includes one or more second illumination sources 52B (e.g. twelve second illumination sources 52B) provided on the outer periphery of the mask 18. In some embodiments, the second illumination sources 52B are arranged to surround the outer periphery of the mask 18. In some embodiments, the second illumination sources 52B are arranged to be lower than the mask 18 in the Z-axis direction (see FIG. 9). However, it should be appreciated that many variations and modifications can be made to the embodiments of the disclosure.

In some embodiments, the first illumination sources 52A are configured to generate a plurality of light beams (see FIG. 12) to illuminate a (three-dimensional) space X (see FIG. 9) over the patterned surface S1 of the mask 18, e.g. before the lithography exposing process (which will be further illustrated later). In some embodiments, the second illumination sources 52B are configured to generate a plurality of light beams (see FIGS. 12 and 13) to illuminate the space X over the patterned surface S1 of the mask 18, e.g. during the lithography exposing process (which will be further illustrated later). In some embodiments, the optical module 50 further includes a number of reflecting mirrors 54 respectively provided adjacent to the first illumination sources 52A and second illumination sources 52B for collecting and directing the light beams from the first illumination sources 52A and second illumination sources 52B uniformly toward the space X over the patterned surface S1 of the mask 18. The space X substantially covers the entire patterned surface S1 of the mask 18.

In some embodiments, the first illumination sources 52A and second illumination sources 52B are selected so that the generated light beams do not react with the photoresist layer coated on the substrate 22 (FIG. 1). In some embodiments, the first illumination sources 52A and second illumination sources 52B are selected so that the first illumination sources 52A and second illumination sources 52B can generate light beams with uniform light intensity. In some embodiments, the first illumination sources 52A and second illumination sources 52B include various illumination sources (e.g. high power mercury lamps) with high luminous flux (e.g. 10000 to 50000 lumens or more lumens) so as to produce enough radiation pressure to push the floating particle P.

With the above configurations, as a floating particle P moves into the space X, the light beams from the first illumination sources 52A and second illumination sources 52B can produce radiation pressure to change the moving direction of the floating particle P and push the floating particle P away from the patterned surface S1 of the mask 18 in the direction of gravity G. It should be appreciated that the light beams from the first illumination sources 52A and second illumination sources 52B exerts radiation pressure on the floating particle P due to reflection and a small fraction that is absorbed. Additionally, the floating particle P that has been turned away is then pulled down by gravity G.

Accordingly, the light beams provided by the optical module 50 can optically form an invisible pellicle IP (as depicted by dashed lines in FIGS. 12 and 13) over the patterned surface S1 of the mask 18 to push contaminant particles P away from the invisible pellicle IP and avoid the contaminant particles P moving onto the patterned surface S1 of the mask 18.

Figure 11:
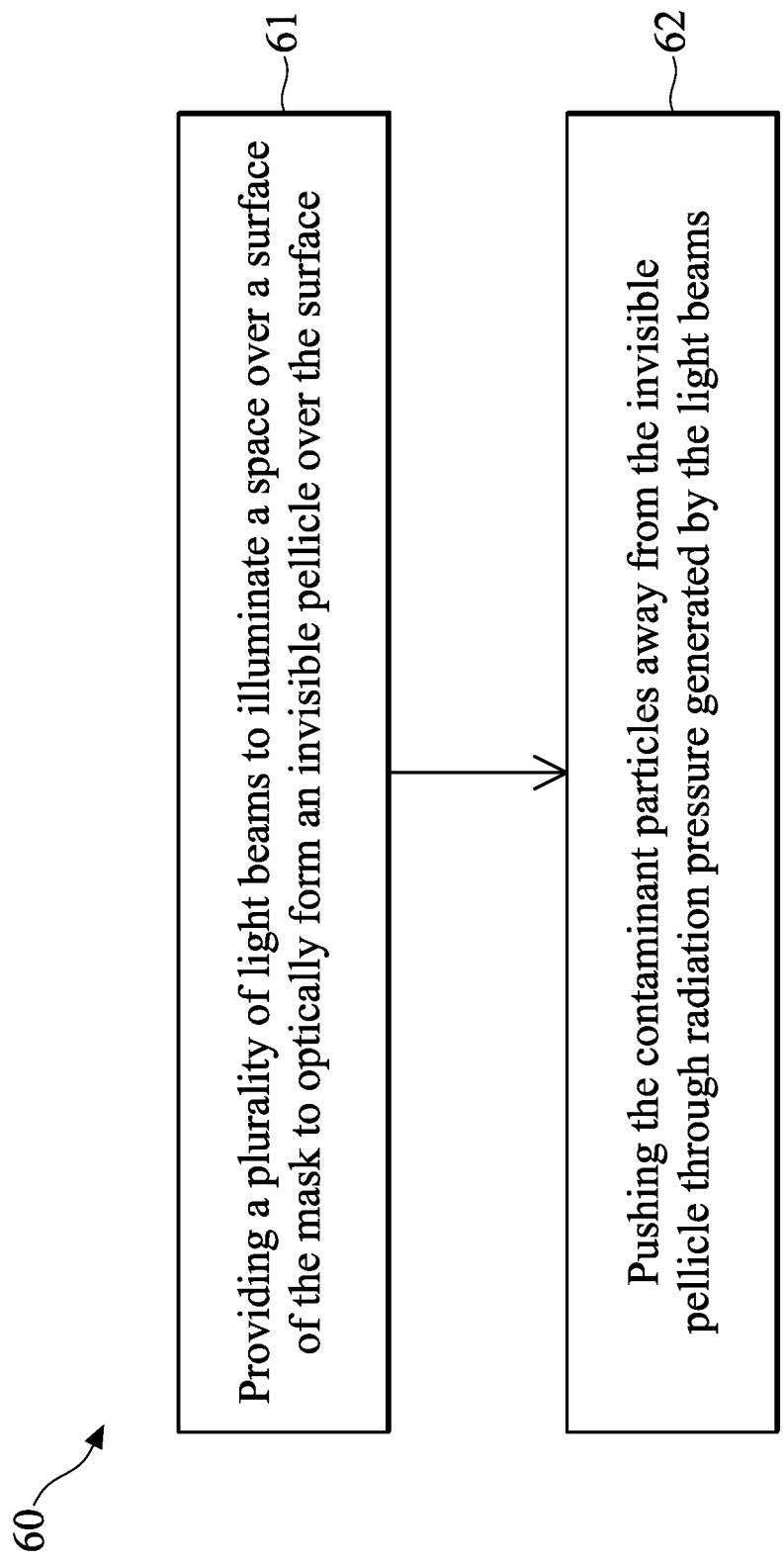
FIG. 11 is a simplified flow chart of a method for protecting a mask from contaminant particles, in accordance with other some embodiments.

FIG. 11 is a simplified flow chart of a method 60 for protecting a mask from contaminant particles, in accordance with other some embodiments. For illustration, the flow chart will be described in company with the schematic views shown in FIGS. 12 and 13.

Figure 13:
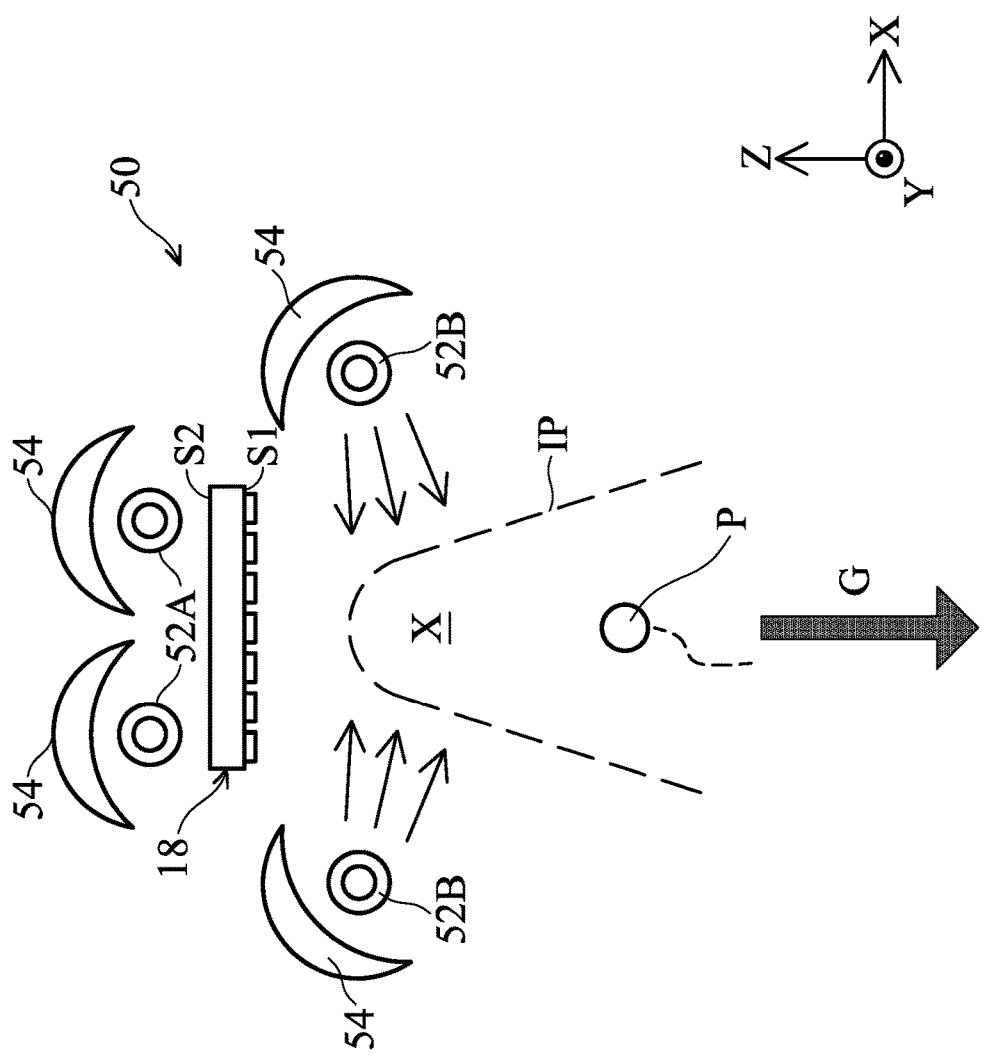
FIG. 13 schematically shows an intermediate stage of a method for protecting a mask from contaminant particles, in accordance with some embodiments.

The method 60 includes an operation 61, in which a plurality of light beams are provided by the optical module 50 (see FIGS. 9 and 10) to illuminate a three-dimensional space X (see FIG. 9) over a surface (e.g. the patterned surface S1) of the mask 18 to optically form an invisible pellicle IP over the patterned surface S1, as shown in FIG. 13. In some embodiments, the optical module 50 includes a number of illumination sources 52, for example, 1000 Watt mercury lamps. In some embodiments, the invisible pellicle IP is curved, according to the positions of the illumination sources 52. In addition, the invisible pellicle IP is formed at a distance from the patterned surface S1 of the mask 18.

The method 60 further includes an operation 62, in which contaminant particles P (e.g. floating particles) are pushed away from the invisible pellicle IP through radiation pressure generated by the light beams from the optical module 50. In some embodiments, the light beams are provided to illuminate the space X over patterned surface S1 of the mask 18 for a predetermined time (e.g. about 10 sec) to generate enough radiation pressure to change the moving direction of the contaminant particles P from upward to downward and to push contaminant particles P away from the invisible pellicle IP. In some embodiments, the contaminant particles P are pushed away from the invisible pellicle IP in the direction of gravity G, and hence gravity G can also help to pull the contaminant particles P down. Accordingly, the invisible pellicle IP prevents the contaminant particles P moving onto the patterned surface S1 of the mask 18.

Figure 12:
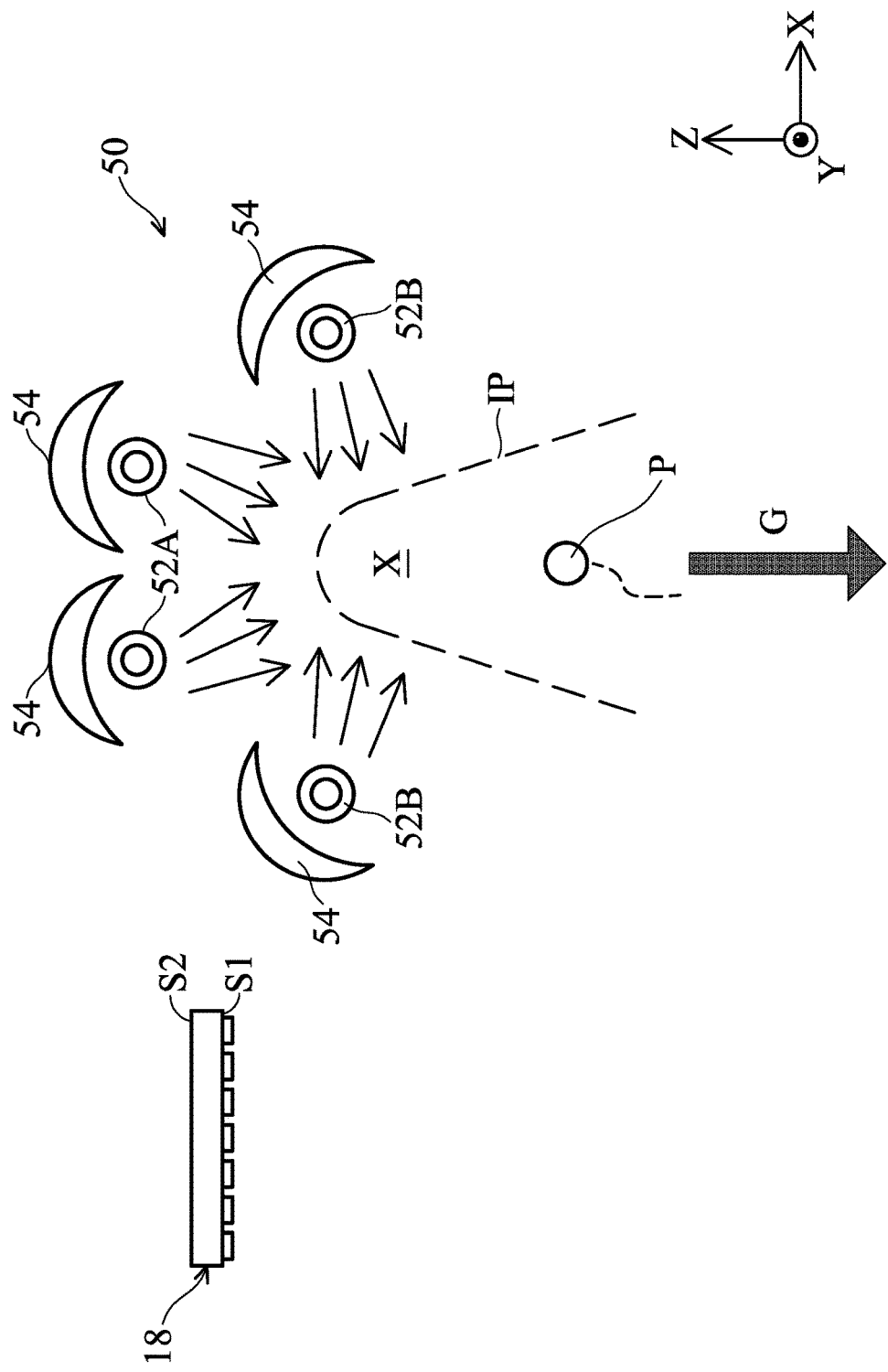
FIG. 12 schematically shows an intermediate stage of a method for protecting a mask from contaminant particles, in accordance with some embodiments.

Some of the operations described above can be modified, replaced or eliminated in different embodiments. Alternatively, some operations may be added in different embodiments. For example, in the operation 61, the light beams may be provided to illuminate the space X over the patterned surface S1 of the mask 18 before, during, and/or after the lithography exposing process. In some embodiments, the operation 61 further comprises providing a plurality of light beams (with a first light intensity), by the first illumination sources 52A and second illumination sources 52B of the optical module 50, to illuminate the space X over the patterned surface S1 of the mask 18 before the lithography exposing process (at this stage, the mask 18 is not in the exposure position and away from the optical module 50), as shown in FIG. 12. In addition, the operation 61 further comprises providing a plurality of light beams (with a second light intensity, wherein the first light intensity is greater than the second light intensity), by the second illumination sources 52B, to illuminate the space X over the patterned surface S1 of the mask 18 during the lithography exposing process (at this stage, the mask 18 is moved to the exposure position), as shown in FIG. 13. In this way, it is possible to more effectively prevent contaminant particles P moving onto the patterned surface S1 of the mask 18.

The embodiments of the present disclosure have some advantageous features: By forming an invisible pellicle through optical method to avoid contaminant particles moving onto the patterned surface of the mask, the yield and quality of the lithography exposing process are improved. Furthermore, as a solid pellicle used in the prior arts is omitted, the critical dimension (CD) error from the boarder effect due to reflection of some light by the solid pellicle and the exposure radiation energy consumption caused by the solid pellicle can be avoided.

In some embodiments, a lithography system is provided. The lithography system includes a mask and an optical module. The optical module is configured to optically form an invisible pellicle over the mask to protect the mask from contaminant particles.

In some embodiments, a method for protecting a mask from contaminant particles is provided. The method includes providing a pair of laser beams to scan back and forth over a surface of the mask to optically form an invisible pellicle over the surface. In addition, the method includes trapping the contaminant particles on the invisible pellicle through radiation pressure generated by the laser beams.

In some embodiments, a method for protecting a mask from contaminant particles is provided. The method includes providing a plurality of light beams to illuminate a space over a surface of the mask to optically form an invisible pellicle over the surface. In addition, the method includes pushing the contaminant particles away from the invisible pellicle through radiation pressure generated by the light beams.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A lithography system, comprising:
   a mask;
   an optical module configured to optically form an invisible pellicle over a surface of the mask to protect the mask from contaminant particles, wherein the optical module includes a pair of laser units including two laser units disposed on opposite sides of the mask, wherein the laser units are configured to generate a pair of opposing laser beams to scan back and forth over the surface of the mask to optically form the invisible pellicle to trap the contaminant particles by clamping the trapped contaminant particles between the opposing laser beams; and
   a particle remover provided on a side of the mask and configured to remove the trapped contaminant particles that are moved away from the surface of the mask by the laser beams.

2. The lithography system as claimed in claim 1, wherein the mask includes a patterned surface and a chucking surface opposite to the patterned surface, the mask is held in the lithography system such that the patterned surface faces a substrate stage, and the invisible pellicle is formed over the patterned surface to avoid contaminant particles moving onto the patterned surface.

3. The lithography system as claimed in claim 2, wherein the laser beams, when scanning over the mask, move the trapped contaminant particles away from the patterned surface.

4. The lithography system as claimed in claim 1, wherein the laser beams produce radiation pressure to trap the contaminant particles on the invisible pellicle.

5. The lithography system as claimed in claim 1, wherein each of the laser units includes a movable optic configured to direct the laser beam.

6. The lithography system as claimed in claim 1, further comprising a blade module configured to define an exposure slit within an exposure field on the mask, and a scan region of the laser beams from the laser units is determined by a position of the blade module relative to the mask and is changed accordingly.

7. The lithography system as claimed in claim 6, wherein the scan region of the laser beams does not exceed boundaries of the blade module.

8. A method for protecting a mask of a lithography system from contaminant particles, comprising:

providing a pair of laser units including two laser units to the lithography system and disposing the two laser units on opposite sides of the mask;

generating a pair of opposing laser beams by the laser units to scan back and forth over a surface of the mask to optically form an invisible pellicle over the surface;

trapping the contaminant particles on the invisible pellicle through radiation pressure generated by the laser beams, wherein the trapped contaminant particles are clamped between the opposing laser beams;

moving the trapped contaminant particles away from the surface of the mask by the laser beams; and removing the trapped contaminant particles after they are moved away from the surface of the mask.

9. The method as claimed in claim 8, wherein the removal of the trapped contaminant particles is achieved by means of electrostatic force or gas flow.

10. The method as claimed in claim 8, wherein the laser beams scanning over the surface of the mask do not interfere with an exposure radiation beam projected onto the surface of the mask during a lithography exposing process.

11. A method for protecting a mask of a lithography system from contaminant particles, comprising:

providing a plurality of illumination sources to the lithography system and disposing the illumination sources near the mask that is movable between an exposure position and a first position away from the exposure position;

before a lithography exposing process where the mask is in the first position, generating a plurality of light beams with a first light intensity by the illumination sources to illuminate a space over a surface of the mask in the exposure position to optically form an invisible pellicle so as to push the contaminant particles away from the invisible pellicle in a direction of gravity; and during the lithography exposing process where the mask is in the exposure position, generating a plurality of light beams with a second light intensity by the illumination sources to illuminate the space over the surface of the mask to optical form the invisible pellicle so as to push the contaminant particles away from the invisible pellicle in the direction of gravity, wherein the first light intensity is different from the second light intensity.

12. The method as claimed in claim 11, wherein the light beams are provided to illuminate the space over the surface of the mask for a predetermined time to generate enough radiation pressure to push the contaminant particles away from the invisible pellicle.

13. The method as claimed in claim 11, further comprising generating a plurality of light beams to illuminate the space over the surface of the mask to optical form the invisible pellicle so as to push the contaminant particles away from the invisible pellicle after the lithography exposing process.

14. The method as claimed in claim 11, wherein the first light intensity is greater than the second light intensity.

15. The method as claimed in claim 11, wherein the illumination sources include at least one first illumination source disposed over the mask and at least one second illumination source disposed on an outer periphery of the mask.

16. The method as claimed in claim 15, wherein the second illumination sources are arranged to surround the outer periphery of the mask.

17. The method as claimed in claim 15, wherein the at least one second illumination source is arranged to be lower the mask in a vertical axis parallel to the direction of gravity.

18. The method as claimed in claim 15, the invisible pellicle is curved depending on the positions of the illumination sources.

19. The method as claimed in claim 11, further comprising providing a plurality of reflecting mirrors arranged adjacent to the illumination sources to collect and direct the light beams toward the space over the surface of the mask.

20. The method as claimed in claim 11, wherein the illumination sources are selected so that the generated light beams do not react with a photoresist layer coated on a substrate subjected to the lithography exposure process.

* * * * *